(12) United States Patent
Oka et al.

(10) Patent No.: US 9,601,442 B2
(45) Date of Patent: Mar. 21, 2017

(54) HALF-MOLD TYPE MOLD PACKAGE

(71) Applicant: DENSO CORPORATION, Kariya, Aichi-pref. (JP)

(72) Inventors: Kengo Oka, Kariya (JP); Tetsuto Yamagishi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/104,255

(22) PCT Filed: Jan. 9, 2015

(86) PCT No.: PCT/JP2015/000074
§ 371 (c)(1),
(2) Date: Jun. 14, 2016

(87) PCT Pub. No.: WO2015/111376
PCT Pub. Date: Jul. 30, 2015

(65) Prior Publication Data
US 2016/0293555 A1    Oct. 6, 2016

(30) Foreign Application Priority Data

Jan. 23, 2014  (JP) .................................. 2014-10397

(51) Int. Cl.
*H01L 23/00* (2006.01)
*H01L 23/31* (2006.01)
(Continued)

(52) U.S. Cl.
CPC ............ *H01L 23/562* (2013.01); *H01L 23/28* (2013.01); *H01L 23/3107* (2013.01);
(Continued)

(58) Field of Classification Search
CPC ............... H01L 23/562; H01L 23/3107; H01L 23/3114; H01L 23/3121; H01L 23/3157; H01L 23/3185
See application file for complete search history.

(56) References Cited

U.S. PATENT DOCUMENTS 5,864,174 A    1/1999  Yamada et al.
6,028,774 A *  2/2000  Shin .................. G06K 19/07745
                                                257/679
(Continued)

FOREIGN PATENT DOCUMENTS

JP    H10-020483 A    1/1998
JP    H11-067801 A    3/1999
JP    2013-152971 A   8/2013

*Primary Examiner* — Michael Jung
(74) *Attorney, Agent, or Firm* — Posz Law Group, PLC

(57) ABSTRACT

A mold package being a half-mold type includes: a substrate includes a first face and a second face; an electronic component that is mounted on the first face; and a mold resin that is provided on the first face and seals the first face with the electronic component. The second face is exposed from the mold resin. The mold resin is disposed on the first face so as to seal a sealed portion and to expose a remaining part of the first face as an exposure portion. One side face is provided by an end side face. One side face is provided by a boundary side face. At least a site on a lower end of the boundary side face is provided by an inclined face. In the boundary side face, a site on an upper end side is provided by an other inclined face having a second inclination angle.

3 Claims, 3 Drawing Sheets

(51) Int. Cl.
*H01L 23/28* (2006.01)
*H05K 3/28* (2006.01)
*H01L 23/498* (2006.01)
*H05K 1/18* (2006.01)

(52) U.S. Cl.
CPC ...... *H01L 23/3114* (2013.01); *H01L 23/3121* (2013.01); *H01L 23/3157* (2013.01); *H01L 23/3185* (2013.01); *H01L 23/49838* (2013.01); *H05K 3/284* (2013.01); *H01L 2224/48091* (2013.01); *H01L 2224/48227* (2013.01); *H01L 2924/1815* (2013.01); *H01L 2924/19105* (2013.01); *H05K 1/181* (2013.01); *H05K 2203/1316* (2013.01)

(56) References Cited

U.S. PATENT DOCUMENTS

| | | |
|---|---|---|
| 6,177,725 B1 | 1/2001 | Yamada et al. |
| 6,459,145 B1 | 10/2002 | Yamada et al. |
| 2002/0195692 A1 | 12/2002 | Yamada et al. |
| 2006/0216827 A1* | 9/2006 | Pulkkinen ............. C22B 23/043 436/43 |
| 2011/0007478 A1 | 1/2011 | Takahashi et al. |
| 2016/0104653 A1 | 4/2016 | Imaizumi et al. |

\* cited by examiner

HALF-MOLD TYPE MOLD PACKAGE

CROSS-REFERENCE TO RELATED APPLICATIONS

The present application is a U.S. national stage of International Application No. PCT/JP2015/000074 filed on Jan. 9, 2015 and is based on Japanese Patent Application No. 2014-10397 filed on Jan. 23, 2014, the disclosures of which are incorporated herein by reference.

TECHNICAL FIELD

The present disclosure relates to a half-mold type mold package in which a part of one face of a substrate made of a mold resin is sealed and the remaining part of the one face is exposed.

BACKGROUND ART

Conventionally, a half-mold type mold package includes a substrate, an electronic component mounted on one face of the substrate, and a mold resin that is provided on the one face of the substrate and seals the one face of the substrate with the electronic component (refer to Patent Literature 1).

The substrate is formed of, for example, a resin such as a printed substrate, and has one face (also referred to as a first face) and the other face (also referred to as a second face) on respective sides of a plate. The other face, which is opposite to the one face in the substrate, is exposed from the mold resin.

The mold resin is disposed on the one face of the substrate, so as to seal a part of the one face of the substrate and expose the remaining part of the one face. The part of the one face of the substrate is provided as a sealed portion that is sealed with the mold resin. The remaining part of the one face is provided as an exposure portion that is exposed from the mold resin. This configuration is made to mount another component that is not sealed with the mold resin on the exposure portion of the one face of the substrate or to connect the substrate to the outside through a wire or the like on the exposure portion.

The inventors of the present application have found the following regarding a mold package.

With the conventional configuration, the sealed portion and the exposure portion in the substrate differ from each other in structural or physical properties, which are caused by the presence or absence of the mold resin such as thickness of the package, coefficient of linear expansion, or the like.

Due to these differences, the exposure portion has greater thermal deformation than the sealed portion in the substrate, and the difference in thermal deformation causes a stress to concentrate on a boundary between the sealed portion and the exposure portion in the substrate. In turn, this may lead to damage at the boundary, for example, a crack on the substrate, and peel-off of the mold resin.

In terms of productivity, the inventors of the present application have tried to manufacture a mold package by employing a MAP (Molded Array Packaging) molding. According to the MAP molding, multiple substrates are collectively sealed with a mold resin and then, the substrate along with the mold resin is cut into individual ones to form one package.

PRIOR ART LITERATURE

Patent Literature

Patent Literature 1: JP 2013-152971 A

SUMMARY OF INVENTION

It is an object of the present disclosure to appropriately suppress a damage on the substrate and the mold resin at a boundary between the sealed portion and the exposure portion of the substrate in a half-mold type mold package, which is manufactured by the MAP molding, in which a part of one face of the substrate made of the mold resin is sealed and the remaining part of the one face is exposed.

According to one aspect of the present disclosure, a mold package being a half-mold type comprising: a substrate that is made of resin and includes a first face and a second face that have relation of front and back faces; an electronic component that is mounted on the first face of the substrate; and a mold resin that is provided on the first face of the substrate, and seals the first face of the substrate with the electronic component, the second face of the substrate being exposed from the mold resin is provided.

The mold resin is disposed on the first face of the substrate so as to seal a sealed portion that is a part of the first face of the substrate, and to expose a remaining part of the first face as an exposure portion. The mold resin is rectangular when viewed from above the first face of the substrate. At least one side face among four side faces of the mold resin, which is rectangular in a plan view, is provided by an end side face that is on the identical plane with an end face of the substrate. At least one side face among the four side faces of the mold resin is provided by a boundary side face that is located at a boundary between the sealed portion and the exposure portion of the first face of the substrate and extends from the first face of the substrate above the first face. At least a site on a lower end of the boundary side face, the lower end contacting the first face of the substrate, is provided by an inclined face that is inclined relative to the first face of the substrate, causing a first inclination angle relative to the first face of the substrate to be an acute angle. The first inclination angle is in a range of 30 degrees to 75 degrees.

As in the present disclosure, when the inclination angle in the mold package is set to be 75 degrees or less, it may be possible to reduce a stress occurring at the boundary of the substrate so as not to cause a crack in the substrate without any substantial problem in a quality assurance of a product.

When the inclination angle is set to 30 degrees or more, it may be possible to increase the mechanical strength of the boundary side face as the inclined face of the mold resin so as not to cause a breakage without any substantial problem in a quality assurance of the product.

Thus, according to the present disclosure, by setting the boundary side face of the mold resin as the inclined face, and setting its inclination angle to be in range of 30 degrees to 75 degrees, it may be possible to appropriately suppress a damage on the substrate and the mold resin at the boundary between the sealed portion and the exposure portion of the substrate.

BRIEF DESCRIPTION OF DRAWINGS

The above and other aspects, features and advantages of the present disclosure will become more apparent from the following detailed description made with reference to the accompanying drawings. In the drawings.

PREFERRED EMBODIMENTS FOR CARRYING OUT INVENTION

The inventors of the present application have earnestly examined a half-mold type mold package produced by MAP molding.

A mold resin is disposed on one face of a substrate so as to seal a sealed portion of the one face and expose an exposure portion of the one face in the substrate. Typically, a planar shape of the one face of the substrate is rectangular when viewed from above of the one face of the substrate. In other words, the contour of the mold resin in the planar shape is defined by four side faces. The inventors of the present application have studied regarding a rectangular mold resin in a plan view.

Figure 1:
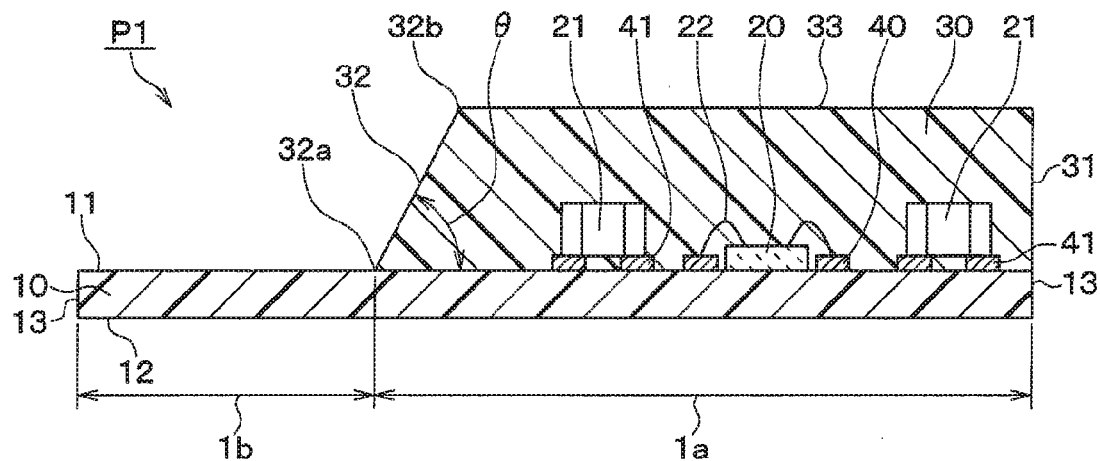
FIG. 1 is a sectional view schematically illustrating a mold package according to a first embodiment of the present disclosure.
Figure 2:
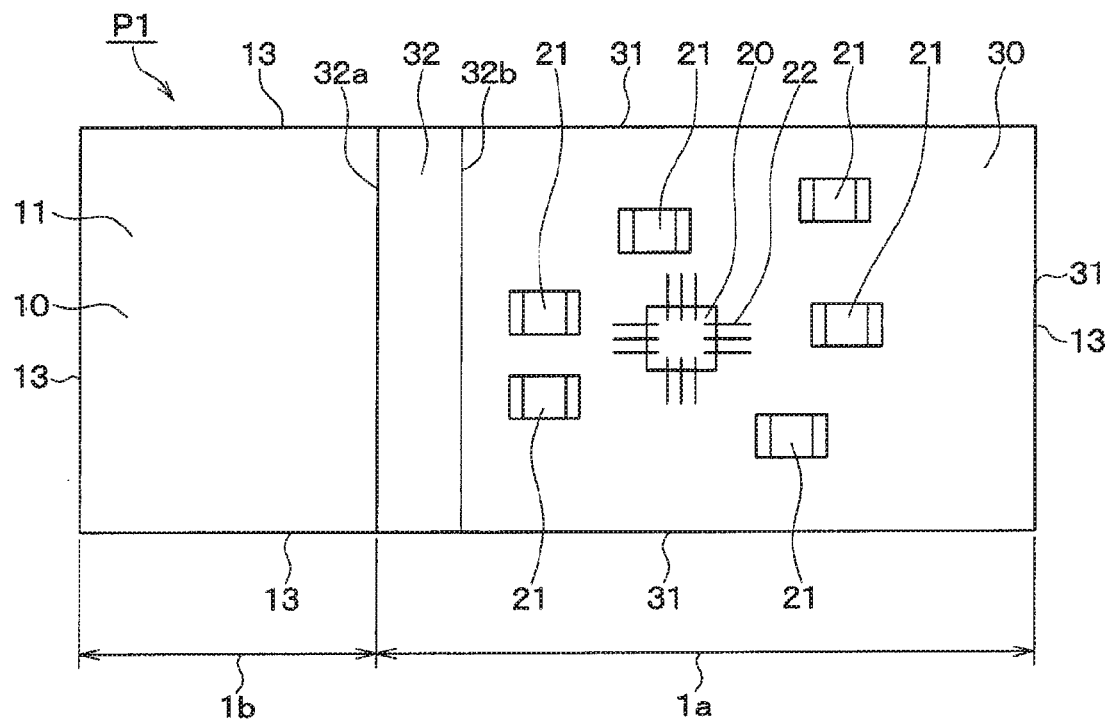
FIG. 2 is a top view schematically illustrating the mold package in FIG. 1.

According to the MAP molding, at least one side face among the four side faces of the rectangular mold resin in the plan view becomes a side face that is flush with an end face of the substrate, that is, an end side face, as a cut face of the mold resin and the substrate after the MAP molding (referring to FIG. 1 and FIG. 2).

The mold resin seals a part of the one face of the substrate, and exposes the remaining part of the one face of the substrate. At least one side face among the four side faces of the mold resin becomes a side face that is located at a boundary between the sealed portion and the exposure portion of the one face of the substrate, and extends from the one face of the substrate above the one face, that is, a boundary side face. The boundary side face of the mold resin is molded with an inner face of a mold for forming the mold resin.

To reduce damage on the substrate and the mold resin at the boundary, the inventors of the present application have thought that the boundary side face of the mold resin is provided by an inclined face which is inclined from a contact point with the one face of the substrate. In doing so, since the thickness of the mold resin becomes gradually smaller toward the lower end as the contact point with the one face of the substrate, on the inclined boundary side face, a stress occurring at the boundary of the substrate may be reduced, and the damage can be suppressed.

When the inclination angle of the inclined face is too small, the mold resin may be too thin on the inclined face. Thus, the mechanical strength of the inclined face of the mold resin may decrease, possibly causing a breakage in the mold resin.

In the configuration including such an inclined face, relation between the inclination angle, and a stress occurring at the boundary of the substrate and the mechanical strength of the mold resin are experimentally searched. The inventors of the present application have found an optimum inclination angle on the basis of experiment results. The present disclosure is devised based on such a search result.

Embodiments of the present disclosure will be described below with reference to drawings. For simplification of description, the same or similar parts in the embodiments are given to the identical reference numerals throughout the drawing.

(First Embodiment)

A mold package P1 according to a first embodiment of the present disclosure will be described below with reference to FIG. 1 and FIG. 2. The mold package P1 is mounted in a vehicle such as a car. The mold package P1 is used to drive various electronic devices for vehicle. In a plan view of FIG. 2, constituents located inside a mold resin 30 are represented by solid lines, with the mold resin 30 removed.

The mold package P1 in the present embodiment broadly includes a substrate 10 having one face 11 and the other face 12 having relation of front and back faces, electronic components 20, 21 mounted on the one face 11 of the substrate 10, and the mold resin 30 that is provided on the one face 11 of the substrate 10 and along with the electronic components 20, 21, seals the one face 11 of the substrate 10.

In the substrate 10, the one face 11 corresponds to a first face, and the other face 12 corresponds to a second face.

The other face 12 opposite to the one face 11 in the substrate 10 is exposed from the mold resin 30. Thus, the mold package P1 is a half-mold type mold package.

The substrate 10 is made from resin such as a printed substrate or the like. Typically, the substrate 10 has a rectangle plate in a plan view. As illustrated in FIG. 2, the substrate 10 is a rectangular plate including the one face 11 and the other face 12, which are front and back faces, respectively, and its contour is defined by four end faces 13. The one face 11 of the substrate 10 is provided with a wire land 40 and a component land 41, which serve to mount and connect the electronic components 20, 21.

Examples of the electronic components 20, 21 include a surface mount component and a through hole mount component, which can be mounted on the one face 11 of the substrate 10, for example. Here, an IC chip 20 and a passive device 21 are shown as an electronic component.

The IC chip 20 is fixed to the one face 11 of the substrate 10 through a mounting material, which is not shown such as a solder, an Ag paste, and is connected to the wire land 40 through a bonding wire 22 made of Au, Al, or the like. The passive device 21 is a capacitor, a resistor, or the like, and is connected to the component land 41 through the mounting material, which is not shown.

The mold resin 30 is made of a molding material generally used for this type of mold package, and contains a filler such as alumina, silica, or the like as necessary. The mold resin 30 is formed using a mold for transfer molding method or compression molding method.

The mold resin 30 is disposed on the one face 11 of the substrate 10 so as to seal a sealed portion 1a that is a part of the one face 11 and expose an exposure portion 1b that is a remaining part of the one face 11 in the substrate 10. The sealed portion 1a of the one face of the substrate 10 is a place where the electronic components 20, 21 are mounted, and the exposure portion 1b is a place where the substrate is connected to the outside through a wire or the like not illustrated on the exposure portion 1b.

The sealed portion 1a corresponds to a sealed portion of the first face of the substrate, and the exposure portion 1b corresponds to an exposure portion of the first face of the substrate.

The mold package P1 is manufactured by MAP molding. That is, the mold package P1 is produced by collectively sealing multiple substrate 10 with the mold resin 30 using a mold and then, cutting the multiple substrate 10 along with the mold resin 30 into individual substrates.

As illustrated in FIG. 2, the planar shape of the mold resin 30 is rectangular which is typical in MAP molding, when viewed from above the one face 11 of the substrate 10. That is, the mold resin 30 is shaped like a rectangular plate, and the contour of the mold resin 30 is defined by four side faces 31, 32.

An upper face 33, which is opposite to the one face 11 of the substrate 10 in the mold resin 30, is entirely flat to provide a flat face. Since the mold resin 30 is formed using a mold by MAP molding, unlike a mold resin formed by potting and other molding methods, the upper face 33 of the mold resin 30 becomes the flat face corresponding to an inner face of the mold. In the case of potting, the upper face of the mold resin typically becomes a convex curved face.

Three side faces among the four side faces 31, 32 of the mold resin 30 having a flat rectangle are provided by three end side faces 31 that are on the identical planes with the respective end face 13 of the substrate 10. The remaining one side face among the four side faces 31, 32 of the mold resin 30 is provided by a boundary side face 32 that is located at a boundary between the sealed portion 1a and the exposure portion 1b of the one face 11 of the substrate 10 and extends from the one face 11 of the substrate 10 above the one face 11.

The side faces 31 correspond to a side face of the mold resin, and the side face 32 corresponds to a boundary side face of the mold resin.

The end side faces 31 of the mold resin 30 are configured as cut faces formed by cutting the mold resin 30 and the substrate 10 in MAP molding. The boundary side face 32 of the mold resin 30 is configured as a face molded by the inner face of the mold.

The boundary side face 32 is an inclined face that is inclined relative to the one face 11 of the substrate 10 so that an angle of the boundary side face 32 relative to the one face 11 of the substrate 10, that is, an inclination angle $\theta$ of the boundary side face 32 relative to the one face 11 of the substrate 10 becomes an acute angle.

The inclination angle $\theta$ corresponds to an inclination angle of the boundary side face.

Here, the boundary side face 32 has a constant inclination angle $\theta$ from a lower end 32a that contacts the one face 11 of the substrate 10 to an upper end 32b that shares a boundary with the upper face 33 of the mold resin 30. That is, the entire boundary side face 32 is provided by an inclined face having the inclination angle $\theta$.

In the present embodiment, the inclination angle $\theta$ is in a range of 30 degrees to 75 degrees. This suppresses damage on the substrate 10 and the mold resin 30 occurring at the boundary between the sealed portion 1a and the exposure portion 1b in the substrate 10 due to thermal deformation caused by a thermal cycle during use in a vehicle. A basis for the range of the inclination angle $\theta$ will be described later.

Here, a specific example of the substrate 10 and the mold resin 30 in the mold package P1 in terms of material and size will be described below. The specific example is a material and size for a typical mold package of this type.

The substrate 10 and the mold resin 30 are made of a typical resin material such as a polyacrylic resin, a polyimide resin, and an epoxy resin. Thickness (that is, a plate thickness) of the substrate 10 and thickness (that is, a plate thickness) of the mold resin 30 are not specifically defined and however, the mold resin 30 may be preferably thicker than the substrate 10.

For example, when the thickness of the substrate 10 is defined as 1, the thickness of the mold resin 30 is desirably in a range of 2.5 to 5. When this relation of the thickness is satisfied, for example, the thickness of the substrate 10 is in a range of 0.6 to 1.6 mm about, and the thickness of the mold resin 30 is in a range of 2.0 to 6.0 mm about.

For physical properties of the substrate 10, preferably, the coefficient of linear expansion is in a range of 8 to 20 ppm, and the Young's modulus is in a range of 10 to 40 GPa. For physical properties of the mold resin 30, preferably, the coefficient of linear expansion is in a range of 9 to 20 ppm, and the Young's modulus is in a range of 10 to 30 GPa.

Figure 3:
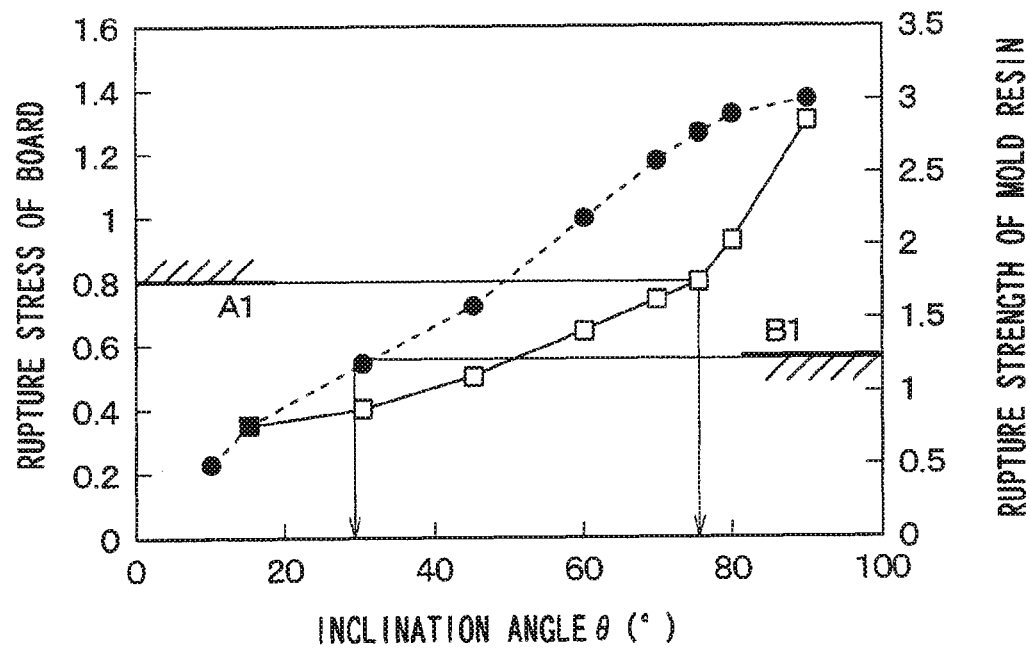
FIG. 3 is a graph illustrating relation between an inclination angle θ, and a rupture stress occurring at a boundary of the substrate and a rupture strength of a boundary side face of a mold resin.

Referring to FIG. 3, the basis for the range of the inclination angle $\theta$ from 30 degrees to 75 degrees will be described. FIG. 3 is a graph created through experiment and examination by using the mold package P1 having typical material and size as indicated in the specific example.

FIG. 3 illustrates results of the rupture stress at the boundary of the substrate 10 with various inclination angles $\theta$, and corresponding breaking strengths of a portion of the mold resin 30 at the boundary side face 32. Here, a horizontal axis represents the inclination angle $\theta$, a left vertical axis represents the rupture stress of the substrate 10 as black circles, and a right vertical axis represents the breaking strength of the mold resin 30 as white squares.

In FIG. 3, the rupture stress of the substrate 10 is a stress with which a crack occurs at the boundary of the substrate 10 due to thermal deformation. The rupture stress is found by simulation, and a value at which a crack occurs in the substrate 10 due to thermal deformation with a probability of standard deviation $-4\sigma$ is standardized as 1. FIG. 3 illustrates relative values.

In FIG. 3, the breaking strength of the mold resin 30 corresponds to a strength with which a portion of the mold resin 30 at the boundary side face 32, which is an inclined face, causes a breakage due to thermal deformation. As illustrated in FIG. 1 and FIG. 2, the portion of the mold resin 30 at the boundary side face 32 refers to a portion immediately below the boundary side face 32 in the mold resin 30.

Since the boundary side face 32 is inclined, this portion immediately below the boundary side face 32 in the mold resin 30 is thinner than a portion immediately below the upper face 33 in the mold resin 30. The breaking strength of the mold resin 30 is found by experiment, and a value at which a breakage occurs in this portion of the mold resin 30 due to thermal deformation with a probability of standard deviation $+4\sigma$ is standardized as 1. FIG. 3 illustrates relative values.

As illustrated in FIG. 3, the rupture stress of the substrate 10 and the breaking strength of the mold resin 30 increase as the inclination angle $\theta$ of the boundary side face 32 of the mold resin 30 becomes larger, and decreases as the inclination angle $\theta$ becomes smaller.

That is, when the inclination angle $\theta$ becomes large, the portion of the mold resin 30 at the boundary side face 32 becomes thick to increase the breaking strength. The rupture stress of the substrate 10 increases, easily generating a crack in the substrate 10. When the inclination angle $\theta$ becomes small, the rupture stress of the substrate 10 decreases. The portion of the mold resin 30 at the boundary side face 32 becomes thin, easily generating a breakage.

The inventors of the present application set standards for the rupture stress of the substrate 10 and the breaking strength of the mold resin 30 to values corresponding to the standard deviation 6σ, which is stricter than standard deviation 4σ. In FIG. 3, the value corresponding to standard deviation −6σ of the rupture stress is 0.8 represented as A1, and the value corresponding to standard deviation 6σ of the breaking strength is 1.2 represented as B1.

When the inclination angle θ is 75 degrees, the rupture stress of the substrate 10 becomes 0.8, that is, the value A1 of the standard deviation −6σ. Thus, the inclination angle θ is determined to be 75 degrees or less. By setting the inclination angle θ to 75 degrees or less, a crack in the substrate due to thermal deformation can be prevented with a probability of standard deviation 6σ.

That is, the stress occurring at the boundary of the substrate can be reduced so as not to cause a crack in the substrate without any substantial problem in product quality.

When the inclination angle θ is 30 degrees, the breaking strength of the mold resin 30 becomes 1.2, that is, the value B1 of the standard deviation +6σ. Thus, the inclination angle θ is determined to be 30 degrees or more. By setting the inclination angle θ to 30 degrees or more, a breakage in the mold resin due to thermal deformation can be prevented with a probability of standard deviation 6σ.

That is, the mechanical strength of the portion of the mold resin at the inclined boundary side face can be increased so as not to cause a breakage without any substantial problem in product quality.

As described above, in the present embodiment, when the inclination angle θ is set to be in the range of 30 degrees to 75 degrees, a crack in the substrate 10 at the boundary between the sealed portion 1a and the exposure portion 1b of the substrate 10 as well as a breakage in mold resin 30 can be suppressed without any substantial problem in product quality. Therefore, damage on the substrate 10 and the mold resin 30 at the boundary can be appropriately suppressed.

(Second Embodiment)

Figure 4:
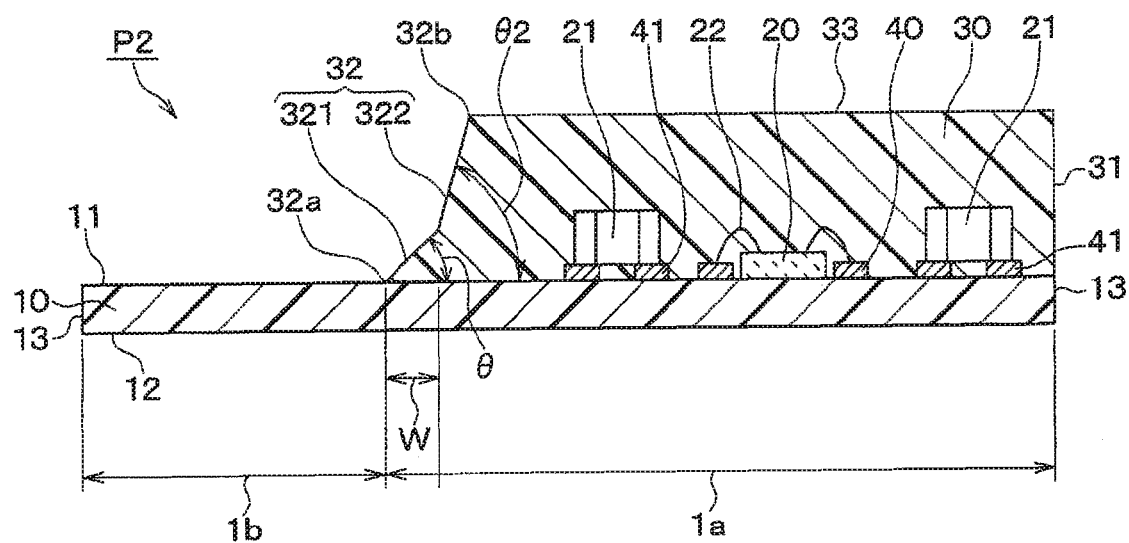
FIG. 4 is a sectional view schematically illustrating a mold package according to a second embodiment of the present disclosure.

Referring to FIG. 4, a mold package P2 according to a second embodiment of the present disclosure will be described mainly on a difference between the present embodiment and the first embodiment.

In the first embodiment, the entire boundary side face 32 of the mold resin 30 constitutes an inclined face having the inclination angle θ. By contrast, in the present embodiment, the boundary side face 32 has a two-staged inclination structure in which a boundary between a site 321 on the lower end 32a side, which contacts the one face 11 of the substrate 10, and a site 322 on the upper end 32b side is dented.

The site 321 on the lower end 32a side may be referred to as a first site. The site 322 on the upper end 32b side may be referred to as a second site.

Specifically, in the present embodiment, the site 321 on the lower end 32a side in the boundary side face 32 is an inclined face having the inclination angle θ, and the site 322 on the upper end 32b side is an inclined face having an inclination angle θ2 relative to the one face 11 of the substrate 10, the inclination angle θ2 being larger than the inclination angle θ and being 90 degrees or less. In other words, the inclination angle θ of the site 321 on the lower end 32a side satisfies 30 degrees≤θ≤75 degrees, and the inclination angle θ2 of the site 322 on the upper end 32b side satisfies θ≤θ2≤90 degrees. The inclination angle θ corresponds to a first inclination angle, and the inclination angle θ2 corresponds to a second inclination angle.

The two-staged inclination structure can reduce the thinned portion of the mold resin 30 at the boundary side face 32. Specifically, when the inclination angle θ is made small, the portion immediately below the site on the lower end 32a side in the mold resin 30 becomes thin. The thickness of the portion immediately below the site 322 on the upper end 32b side can be ensured.

The present embodiment is preferable in suppressing a breakage in the mold resin 30 at the boundary between the sealed portion 1a and the exposure portion 1b. In consideration of this, as illustrated in FIG. 4, when the inclination angle θ is equal to 30 degrees, a width W of the portion immediately below the site on the lower end 32a side in the mold resin 30 is desirably 0.5 mm or less.

The site 321 on the lower end 32a side in the boundary side face 32 in the present embodiment is inclined as in the first embodiment. Therefore, a crack in the substrate 10 and a breakage in the mold resin 30 at the boundary can be similarly prevented.

That is, as long as at least the site 321 on the lower end 32a side in the boundary side face 32 of the mold resin 30 is an inclined face having an inclination angle θ in the range of 30 degrees to 75 degrees, damage on the substrate 10 and the mold resin 30 at the boundary can be appropriately suppressed.

(Third Embodiment)

Figure 5:
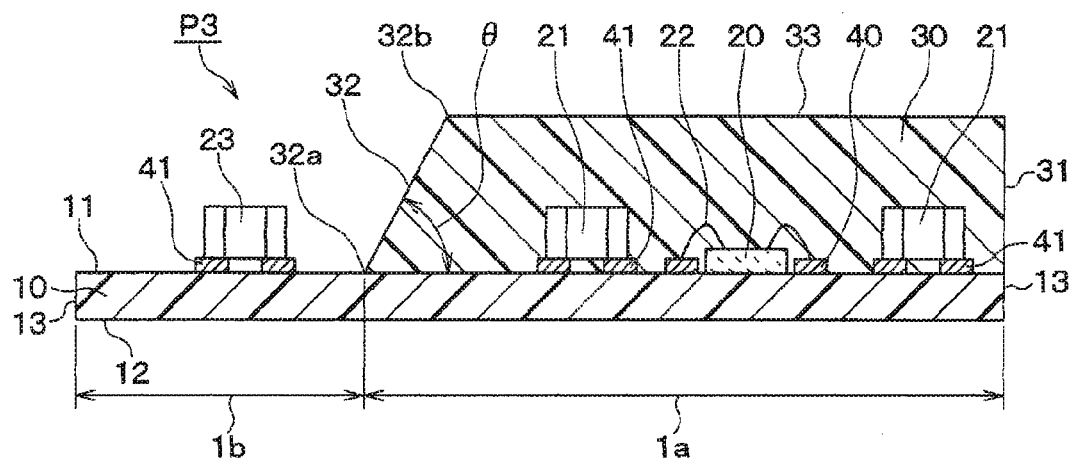
FIG. 5 is a sectional view schematically illustrating a mold package according to a third embodiment of the present disclosure.

A mold package P3 according to a third embodiment of the present disclosure will be described below with reference to FIG. 5. In the present embodiment, a passive device 23, which is another component that is not sealed with the mold resin 30, is mounted on the exposure portion 1b of the one face 11 of the substrate 10. The passive device 23 is selected from among components that can be used as the passive devices 21 in the first embodiment. It is noted that another component may be a surface mount component or a through hole mount component other than the passive device.

(Other Embodiments)

Figure 6:
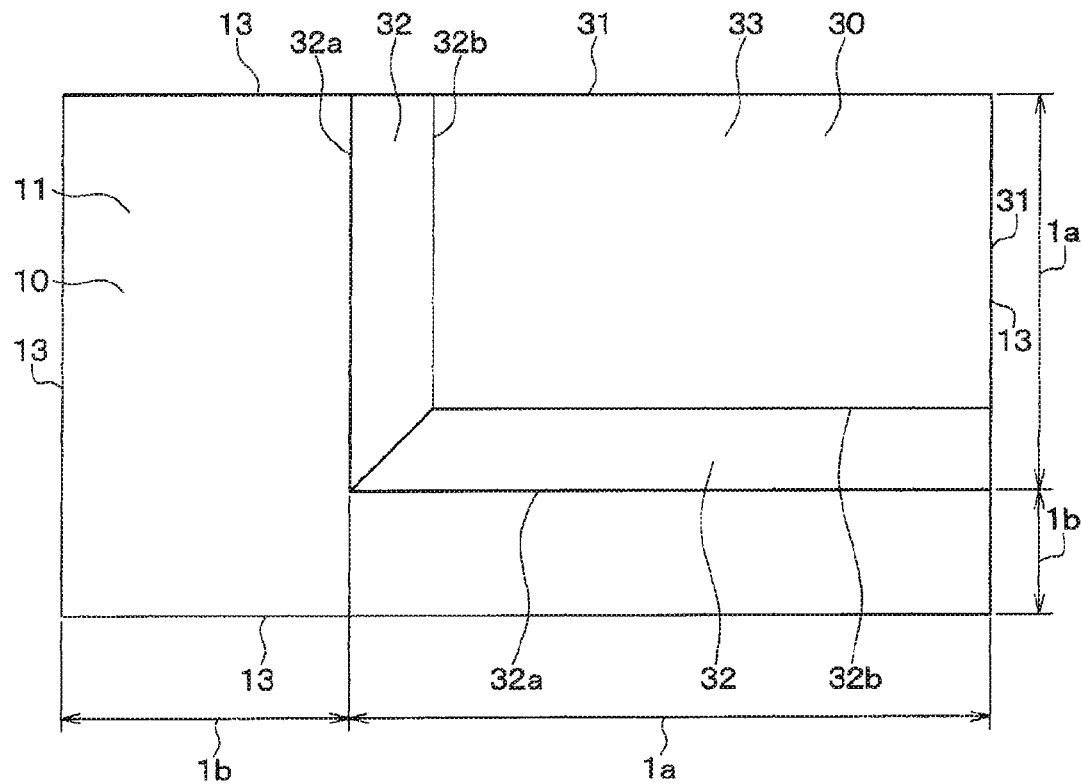
FIG. 6 is a top view illustrating a mold package according to another embodiment of the present disclosure.

In each of the above embodiments, three of the four side faces of the mold resin 30 are the end side faces 31, and the remaining one side face is the boundary side face 32. However, the present disclosure is not limited to this, and as illustrated in FIG. 6, two of the four side faces may be the end side faces 31, and the remaining two end faces may be the boundary side face 32.

Although not illustrated, one of the four side faces may be the end side face 31, and the remaining three may be the boundary side faces 32. That is, the mold resin 30 only needs to include at least one end side face 31 and at least one boundary side face 32 among the four side faces.

In the second embodiment, the site 322 on the upper end 32b side in the boundary side face 32 may be inclined in more stages. Also in this case, inclination angles of multiple inclined faces in the site 322 on the upper end 32b side each must be larger than the inclination angle θ of the site 321 on the lower end 32a side and be 90 degrees or less.

Furthermore, the present disclosure is not limited to the above described embodiments, and can be appropriately modified within a range described in the present disclosure. It should be noted that each of the embodiments is not unrelated to each other, and can be combined with appropriately except for a case where a combination is obviously impossible. It should be noted that each of the embodiments is not limited to the drawings.

The invention claimed is:

1. A mold package being a half-mold type comprising:
a substrate that is made of resin and includes a first face and a second face that have relation of front and back faces;
an electronic component that is mounted on the first face of the substrate; and
a mold resin that is provided on the first face of the substrate, and seals the first face of the substrate with the electronic component,
wherein:
the second face of the substrate is exposed from the mold resin;
the mold resin is disposed on the first face of the substrate so as to seal a sealed portion that is a part of the first face of the substrate, and to expose a remaining part of the first face as an exposure portion;
at least one side face among side faces of the mold resin is provided by an end side face that is on an identical plane with an end face of the substrate;
at least one side face among the side faces of the mold resin is provided by a boundary side face that is located at a boundary between the sealed portion and the exposure portion of the first face of the substrate and extends from the first face of the substrate above the first face;
at least a site on a lower end of the boundary side face, the lower end contacting the first face of the substrate, is provided by an inclined face that is inclined relative to the first face of the substrate, causing a first inclination angle relative to the first face of the substrate to be an acute angle;
the first inclination angle is in a range of 30 degrees to 75 degrees;
in the boundary side face, the site on the lower end side is provided by the inclined face having the first inclination angle; and
in the boundary side face, a site on an upper end side further from the first face than the site on the lower end side is provided by an other inclined face having a second inclination angle relative to the first face of the substrate, the second inclination angle being larger than the first inclination angle of the site on the lower end side and being 90 degrees or less.

2. The mold package according to claim 1, wherein:
an upper face of the mold resin opposite to the first face of the substrate is flat entirely.

3. The mold package according to claim 1, wherein:
an other component is mounted on the exposure portion of the first face of the substrate.

* * * * *